US006842489B2

(12) United States Patent
Masenten

(10) Patent No.: US 6,842,489 B2
(45) Date of Patent: Jan. 11, 2005

(54) COHERENT ADAPTIVE CALIBRATION SYSTEM AND METHOD

(75) Inventor: Wesley K. Masenten, Irvine, CA (US)

(73) Assignee: Ditrans IP, Inc., Menlo Park, CA (US)

( * ) Notice: Subject to any disclaimer, the term of this patent is extended or adjusted under 35 U.S.C. 154(b) by 0 days.

(21) Appl. No.: 10/391,038

(22) Filed: Mar. 17, 2003

(65) Prior Publication Data

US 2003/0179836 A1 Sep. 25, 2003

Related U.S. Application Data

(63) Continuation of application No. 09/325,073, filed on Jun. 3, 1999, now Pat. No. 6,535,560.

(51) Int. Cl.[7] .................................................. H04L 5/12
(52) U.S. Cl. ....................... 375/261; 375/317; 375/324; 375/340; 375/345; 455/138; 455/234.1; 455/240.1; 455/245.1; 455/326
(58) Field of Search ................................ 375/261, 316, 375/317, 324, 340, 345, 349; 455/63, 67.3, 138, 232.1, 234.1, 239.1, 340.1, 245.1, 247.1, 250.1, 326, 240.1; 329/308, 363

(56) References Cited

U.S. PATENT DOCUMENTS

| | | | |
|---|---|---|---|
| 4,953,182 A | 8/1990 | Chung | |
| 5,249,203 A | 9/1993 | Loper | |
| 5,422,889 A | 6/1995 | Sevenhans et al. | |
| 5,557,642 A | 9/1996 | Williams | |
| 5,604,929 A | 2/1997 | Loper et al. | |
| 5,705,949 A | 1/1998 | Alelyunas et al. | |
| 5,828,955 A | 10/1998 | Lipowski et al. | |
| 5,847,619 A | 12/1998 | Kirisawa | |
| 5,872,540 A | 2/1999 | Casabona et al. | |
| 6,289,048 B1 | 9/2001 | Richards et al. | |
| 6,340,883 B1 | 1/2002 | Nara et al. | |
| 6,714,584 B1 | 3/2004 | Ishii et al. | |

FOREIGN PATENT DOCUMENTS

| | | |
|---|---|---|
| DE | 19616368 | 11/1997 |
| EP | 180339 | 4/1986 |
| WO | WO 0108292 | 2/2001 |
| WO | WO 0120795 | 4/2001 |

OTHER PUBLICATIONS

Anvari, K., et al. (1991) Performance of a direct conversation receiver with π/4–DQPSK modulated signal. IEEE CH2944–7/91/0000/0822 822–827.

Candy, J.C., et al. (1992) Oversampling delta–sigma data converters. IEEE Press, New York 1–29.

Crochiere, R.E., et al. (1983) AT&T multirate digital signal processing. Prentice–Hall, Inc., Englewood Cliffs, N.J. 07632 143–183.

Jantzi, S.A., et al. (1997) Quadrature bandpass ΔΣ modulationfor digital radio. IEEE Journal of Solid–State Circuits 32(12):1935–1950.

Norsworhty, S.R., et al. (1997) Delta–sigma data converters theory, design and simulation. ISBN 0–7803–1045–4 1–74.

Proakis, J.G., et al. (1992) Advanced digital signal processing. MacMillian Publishing Co., New York 142–151.

Razavi, B. (1997) Design considerations for direct–conversion receivers. IEEE Transactions on Circuits and Systems–II: Analog and Digital Signal Processing. 44(6):428–435.

Weaver, D.K., Jr. (1956) A third method of generation and detection of single–sideband signals. Proceedings of the IRE 44:1703–1705.

European Search Report dated Nov. 13, 2002.

*Primary Examiner*—Dac V. Ha
(74) *Attorney, Agent, or Firm*—Knobbe, Martens, Olson & Bear, LLP

(57) ABSTRACT

A receiver is adaptively calibrated by using a coherent reference signal. The reference signal is selected to be offset from a center frequency of the calibration signal such that the resultant product is offset from baseband by some small amount. The resultant product is used to determine a next value of the calibration parameters.

27 Claims, 6 Drawing Sheets

COHERENT ADAPTIVE CALIBRATION SYSTEM AND METHOD

REFERENCE TO PRIOR APPLICATION

This application is a continuation of application Ser. No. 09/325,073, filed Jun. 3, 1999, now U.S. Pat. No. 6,535,560.

BACKGROUND OF THE INVENTION

1. Field of the Invention

The present invention relates to a wireless communications. More particularly, the present invention relates to adaptive calibration of a receiver system.

2. Description of the Related Art

With the advent and proliferation of digital communications systems, the need for low cost, high performance radio receivers continues to accelerate. These needs have prompted a strong interest in the development of direct conversion receiver architectures that implement a single conversion from a wireless link carrier frequency to a baseband frequency. The reduced complexity of direct conversion receivers holds great potential for reduced cost and increased performance.

Many modern digital communications systems use a form of quadrature modulation in which the wireless signal includes in-phase (I) and quadrature (Q) components which carry information with a relative phase offset of 90°. Typically, the in-phase and quadrature components are received using two distinct signal paths within a direct conversation receiver. Any difference in the gain or phase between the two paths corrupts the information in the signal. In addition, any DC offset or low frequency noise voltage which is generated by the receiver also corrupts the information in the signal.

In order to reduce the corruption, direct conversion receivers often employ an adaptive calibration mechanism. For example, prior art systems have been proposed which include a non-coherent adaptive calibration mechanism. However, such non-coherent adaptive calibration mechanisms exhibit high noise figures and, thus, do not accurately calibrate for receiver imperfections.

Therefore, there is a need in the art to develop an adaptive calibration system which provides accurate, low noise calibration.

SUMMARY OF THE INVENTION

A coherent adaptive calibration receiver and method is used to adjust for errors within a receiver, such as, for example, a direct conversion receiver used to receive a radio frequency signal. A series of first channel signal samples are summed with a first channel offset correction parameter to produce a corrected series of first channel samples. A series of second channel signal samples are summed with a second channel offset correction parameter and then multiplied by a gain imbalance correction parameter and summed with a product of the corrected series of the first channel samples and a phase error correction parameter to create a corrected set of second channel samples. When corrected, the first and second channels are orthogonal to one another.

The corrected series of first channel samples are multiplied with a first sinusoidal waveform to determine a first product. The corrected series of second channel samples are multiplied with a second sinusoidal waveform to determine a second product, the second sinusoidal waveform being 90 degrees out of phase with the first sinusoidal waveform.

The first product is filtered to determine a first channel gain imbalance measurement. The second product is filtered to determine a second channel gain imbalance measurement. A next value of the gain imbalance correction parameter is determined based upon the first and second channel gain imbalance measurements. In one embodiment, the multiplication and filtering are performed digitally.

Alternatively or in addition, the corrected series of second channel samples is multiplied with the first sinusoidal waveform to determine a third product. The third product is filtered to determine a phase error measurement. A next value of the phase correction parameter is determined based upon the first gain imbalance measurement and the phase error measurement.

In one embodiment, the invention is embodied in a receiver. The receiver has a first summer configured to sum a series of first channel signal samples with a first channel offset correction parameter to produce a corrected series of first channel samples. The receiver also has a first multiplier configured to multiply the corrected series of the first channel samples and a phase error correction parameter. A second summer is configured to sum a series of second channel signal samples with a second channel offset correction parameter. A second multiplier is configured to multiply an output of the second summer by a gain imbalance correction. A third summer is configured to sum an output of the first multiplier and the second multiplier to create a corrected set of second channel samples, wherein the second channel is orthogonal to the first channel. A third multiplier is configured to multiply the corrected series of first channel samples by a first digitized sinusoidal waveform. A fourth multiplier configured to multiply the corrected series of second channel samples by a second digitized sinusoidal waveform, the second digitized sinusoidal waveform being 90 degrees out of phase with the first digitized sinusoidal waveform. A first digital filter configured to filter an output of the third multiplier to determine a first channel gain imbalance measurement. A second digital filter configured to filter an output of the fourth multiplier to determine a second channel gain imbalance measurement. A calculator configured to determine a next value of the gain imbalance correction parameter based upon the first and second channel gain imbalance measurements.

In another embodiment, the invention is embodied in a receiver which has a first summer configured to sum a series of first channel signal samples with a first channel offset correction parameter to produce a corrected series of first channel samples. A first multiplier is configured to multiply the corrected series of the first channel samples and a phase error correction parameter. A second summer is configured to sum a series of second channel signal samples with a second channel offset correction parameter. A second multiplier is configured to multiply an output of the second summer by a gain imbalance correction. A third summer is configured to sum an output of the first multiplier and the second multiplier to create a corrected set of second channel samples, wherein the second channel is orthogonal to the first channel. A third multiplier is configured to multiply the corrected series of first channel samples by a first digitized sinusoidal waveform. A fourth multiplier is configured to multiply the corrected series of second channel samples by the first sinusoidal waveform to determine a third product. A first digital filter is configured to filter an output of the third multiplier to determine a first channel gain imbalance measurement. A second digital filter configured to filter an output of the fourth multiplier to determine a phase error measurement. A calculator configured to determine a next value of the phase correction parameter based upon the first gain imbalance measurement and the phase error measurement.

BRIEF DESCRIPTION OF THE DRAWINGS

The features, objects and advantages of the present invention will become more apparent from the detailed description set forth below when taken in conjunction with the drawings in which like reference characters correspond throughout, and wherein.

DETAILED DESCRIPTION OF THE INVENTION

Adaptive calibration is used to compensate for corruption introduced by a receiver. Adaptive calibration involves the measurement of current corruption, the calculation of updated correction parameters and the application of the updated correction parameters to the received signal. The process is iterative, and the calibration parameters adapt to the current operation conditions. For example, the corruption introduced by the receiver is typically a function of the frequency of operation and the temperature of operation. Thus, the corruption introduced by the receiver changes as a function of time. The iterative nature of adaptive calibration allows for compensation of such time varying operation. Corruption introduced by the receiver can create errors in the resulting digital bits output by the receiver and, thus, degrades the overall system performance.

Figure 1:
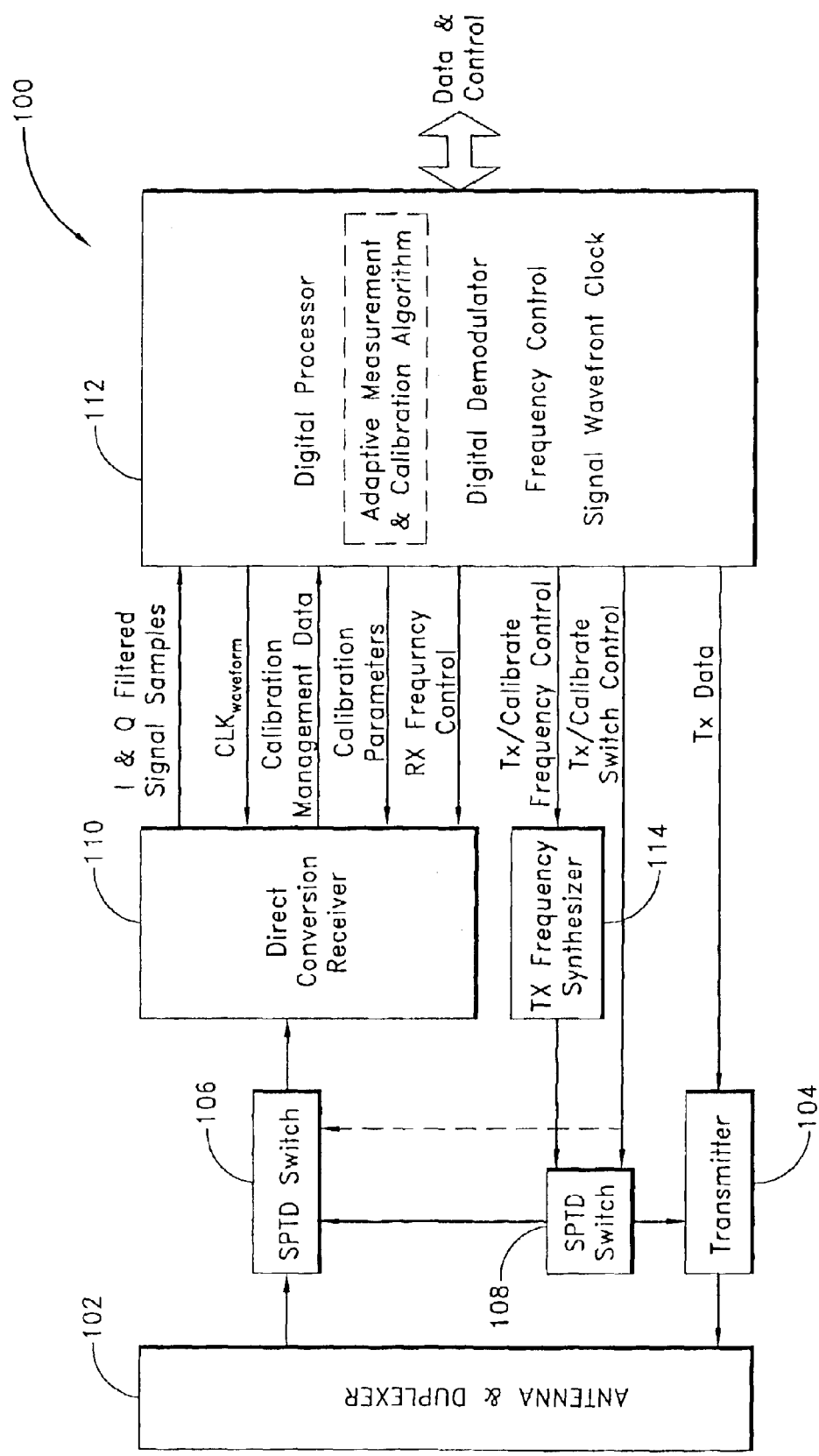
FIG. 1 is a block diagram of a communication system comprising a direct conversion receiver and an adaptive calibration system according to the invention.

FIG. 1 is a block diagram of a communication system 100. The communication system comprises an adaptive calibration system and method according to the invention for compensating for gain imbalances, quadrature errors and direct current (DC) and low frequency offset errors that occur in the implementation of a direct conversation digital receiver. An antenna and duplexer 102 couple the communication system 100 to and from a wireless link. In one embodiment, the antenna and duplexer 102 comprises a bandpass filter which functions to reduce the level of interfering signals outside of the range of received frequencies and prevents the aliasing of out of band energy into the signal band. The antenna and duplexer 102 couple receive signals from the wireless link to a single pole, double throw switch 106. Alternatively, as explained in more detail below, the switch 106 can be embodied as a coupler. In either case, the switch 106 couples receive signals from the antenna and duplexer 102 to a direct conversion receiver 110 (which is explained more fully below). The direct conversion receiver 110 receives the modulated signal at the wireless carrier frequency ($f_c$) and produces in-phase (I) and quadrature (Q) filtered signal samples. The antenna and duplexer 102 couple transmission signals from a transmitter 104 to the wireless link.

The I and Q filtered signal samples are output by the direct conversion receiver 110 to a digital processor 112. The digital processor 112 digitally demodulates the signal samples. In addition to many other functions, the digital processor 112 also provides frequency control, a signal waveform clock and transmission data. In one embodiment, the digital processor 112 is a general purpose microprocessor executing software code. Alternatively, the functions of the digital processor 112 can be implemented in an application specific integrated circuit (ASIC), with discrete hardware components, with software or with a combination of these.

As noted above, the communication system 100 incorporates an adaptive calibration system. The adaptive calibration system is used to compensate for corruption introduced by the direct conversion receiver 110. The adaptive calibration system is comprised of three functions: measurement, calculation and correction. In order to implement these functions, a calibration signal is generated and passed through the direct conversion receiver 110 and the results are analyzed by an adaptive measurement and calibration algorithm within the direct conversion receiver 110 and digital processor 112. For example, in one embodiment, during standard mode operation, a transmit frequency synthesizer 114 is used to generate a conversion signal for use within the transmitter 104. During calibration mode, the transmit frequency synthesizer 114 generates the RF calibration signal at the RF calibration frequency ($f_0$). A single pole, double throw switch 108 under the control of the digital processor 112 couples the output of the transmit frequency synthesizer 114 to either the switch 106 or the transmitter 104. (In one embodiment, the switch 108 and the switch 106 are embodied in a single integrated component using techniques well known in the art of switching.) During calibration mode, the switch 108 couples the RF calibration signal through the switch 106 to the direct conversion receiver 110. The direct conversion receiver 110 down-converts the calibration signal in the same manner as the wireless link RF carrier signal and generates I and Q filtered calibration samples for measurement. The direct conversion receiver 110 measures the errors introduced by the signal paths. Based on the measurements, the digital processor 112 calculates a series of calibration parameters and passes the calibration parameters to the direct conversion receiver 110. The direct conversion receiver 110 uses the calibration parameters in order to correct for the measured errors.

The communication system 100 operates in one of two operational modes: standard operation mode and calibration mode. In standard operation mode, the direct conversion receiver 110 uses the current correction parameters to compensate for corruption. In standard operation mode, the communications system 100 does not perform the measurement and calculation functions.

In calibration mode, the direct conversion receiver 110 measures the current operating conditions. Three different calibration modes are possible. Any one implementation can incorporate one, two or all three calibration modes. The three calibration modes are (1) concurrent external calibration mode, (2) concurrent internal calibration mode and (3) exclusive internal calibration mode.

During both internal calibration modes, the communication system 100 generates a calibration signal which is coupled to the direct conversion receiver 110. In concurrent internal calibration, the switch 106 functions as a coupler and the calibration signal is coupled to the direct conversion receiver 110 in addition to the wireless link signals received from the antenna and duplexer 102. In exclusive internal calibration mode, the switch 106 acts as a single pole, double throw switch which couples the input of the direct conversion receiver 110 to the calibration signal and decouples the direct conversion receiver 110 from the wireless link signal input from the antenna and duplexer 102.

In the external calibration mode, one of the input communication signals is used as the calibration signal. For example, the wireless link carries a calibration signal in the form of a constant waveform (CW) or narrow band data signal. In such a case, the switch 106 simply couples the output of the antenna duplexer 102 directly to the direct conversation receiver 110. Use of a communication signal for calibration eliminates the cost associated with generation of a separate calibration signal. The disadvantage of such operation is a reduction in overall system capacity and performance and the possibility of an increased noise level associated with the calibration process.

As noted above, during calibration mode, the measurement and calculation functions are executed. If accurate measurements and correct calculations can be achieved while operating in concurrent internal calibration mode, it is the preferred calibration mode. However, if prevailing conditions, such as the current operating levels of the wireless link signals, prevent accurate measurement in concurrent internal calibration mode, one of the other calibration modes can be used.

In the embodiment shown in FIG. 1, the calibration signal is generated by the transmit frequency synthesizer 114. The generation of the calibration signal by the transmit frequency synthesizer 114 provides an efficient architecture especially in those systems in which full duplex operation is not required. For example, in a Global System of Mobile Communications (GSM) system and in an United States Time Division Multiple Access (TDMA) system operating according to IS-54, the transmit and receive functions are time multiplexed leaving the transmit frequency synthesizer 114 idle during receive periods. Also, in such a TDMA system, the use of exclusive internal calibration mode during the period where no receive signal is directed towards the communication system 100 can provide an accurate measurement without sacrificing significant system performance. In an alternative embodiment, the calibration signal is generated by another frequency synthesizer such as, for example, a dedicated calibration signal synthesizer. A dedicated synthesizer can be used in a full duplex system, such as a CDMA system, and if re-calibration is required more often than the duty cycle of the transmitter permits.

Figure 2:
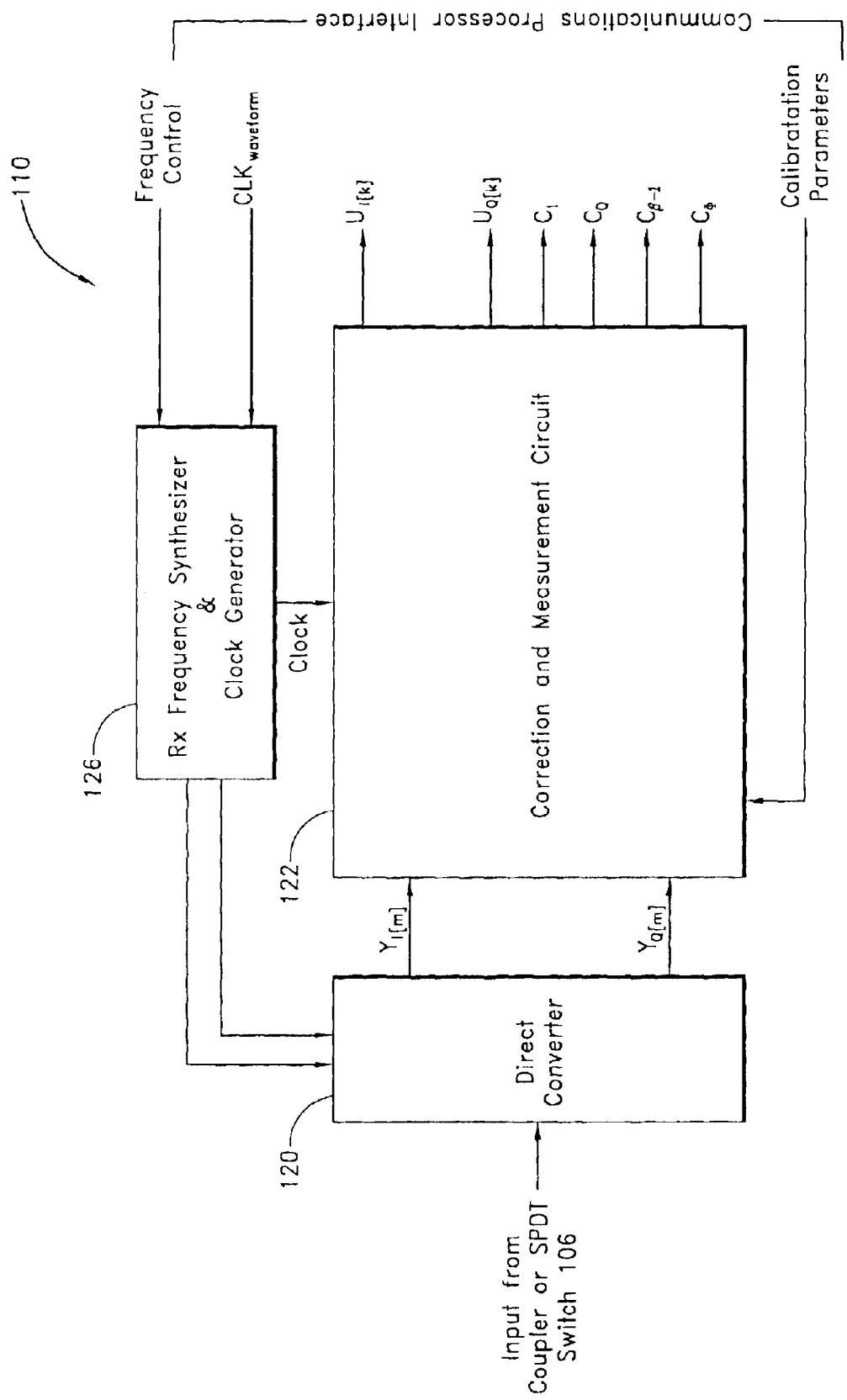
FIG. 2 is a block diagram of a direct conversion receiver according to the invention.

FIG. 2 is a block diagram showing the direct conversion receiver 110 in greater detail. The direct conversion receiver 110 is comprised of a direct converter 120 which implements the actual down-conversion of the wireless link and calibration signals. For example, in one embodiment, the conversion is accomplished using translating delta-sigma modulators and decimation filtering. In another embodiment, the direct converter 120 is implemented using standard balanced mixers or other continuous time elements and the resultant analog signal is digitized in an analog-to-digital converter. In either case, the direct converter 120 comprises both an I path and a Q path and outputs in-phase path digital samples, $Y_I[m]$, and quadrature path digital samples, $Y_Q[m]$.

The output of the direct converter 120 is coupled to a correction and measurement circuit 122. The correction and measurement circuit 122 applies the current correction parameters to the digital samples. The correction and measurement circuit 122 outputs the corrected digital samples for the in-phase path, $U_I[k]$, and quadrature path, $U_Q[k]$, to the digital processor 112.

In calibration mode, the correction and measurement circuit 122 applies calibration parameters to the calibration signal. The correction and measurement circuit 122 then measures the resultant signal and generates measured parameters, $C_I(j,f_{RX})$, $C_Q(j,f_{RX})$, $C_{\beta-I}(j,f_{RX},f_\lambda)$ $C_{\beta-Q}(j,f_{RX},f_\lambda)$ and $C_\phi(j,f_{RX},f_\lambda)$ (each of which is explained more fully below) and supplies them to the digital processor 112.

A receive frequency synthesizer and clock generator 126 receives frequency control information from the digital processor 112 and a clock waveform from the digital processor 112. The synthesizer 126 produces a conversion reference signal having a frequency, $f_{RX}$, approximately equal to or equal to a multiple of the RF carrier frequency of the wireless link signal which is currently being received. In addition, the synthesizer 126 produces a clock which is used by the analog-to-digital conversion process within the direct converter 120 and also by the correction and measurement circuit 122 to maintain synchronization between its input and its output.

In the preferred embodiment, during any one of the calibration modes, a calibration signal having a frequency $f_O$ is input into the direct converter 120. The direct converter 120 translates the calibration signal to a baseband frequency $f_{OBB}=f_{RX}-f_O$. During concurrent mode calibration, the down-converted calibration frequency, $f_{OBB}$, where $f_{OBB}$ is greater than zero, is chosen to be outside of the bandwidth of the signals of interest so as not to interfere with the signals of interest.

Figure 3:
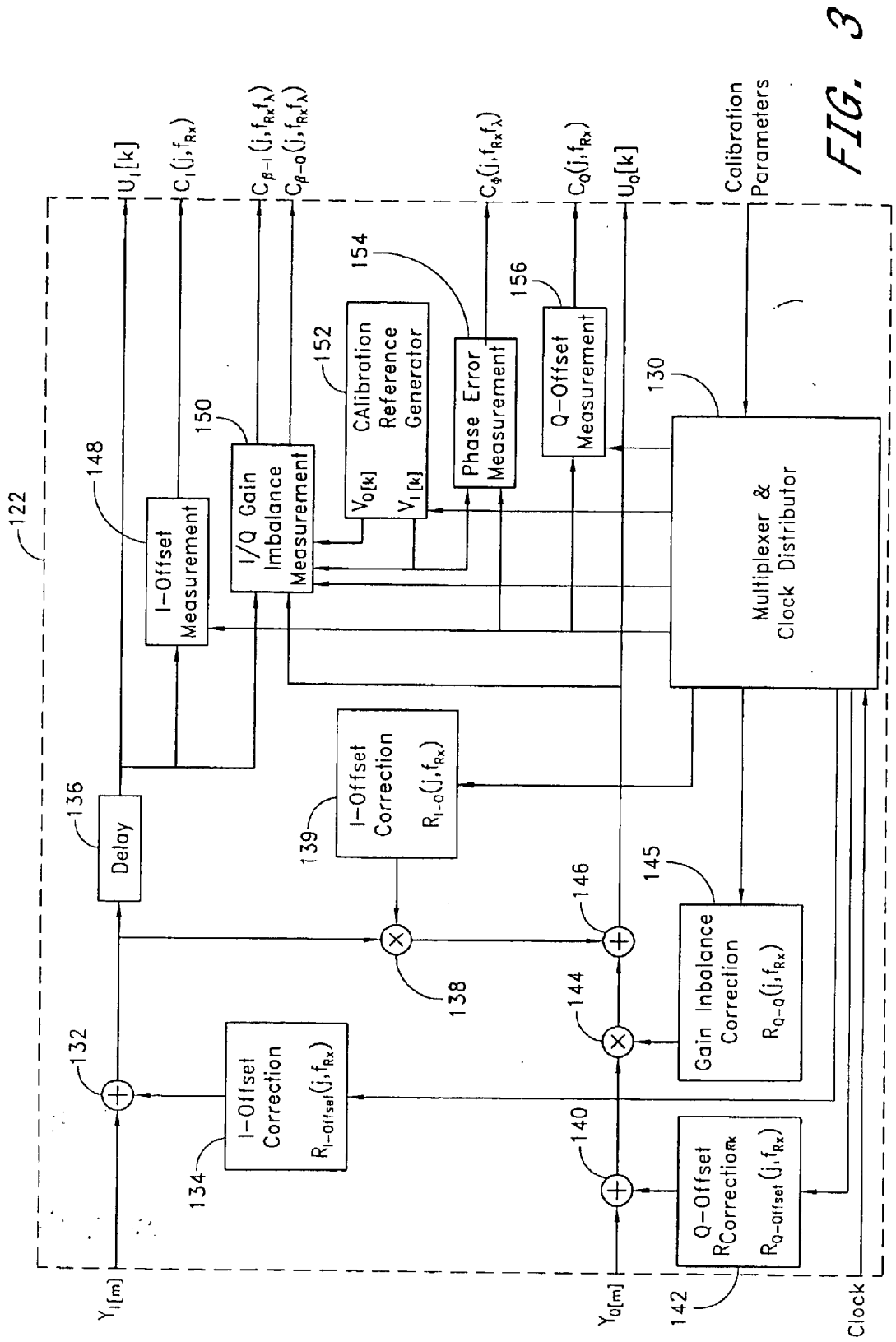
FIG. 3 is a block diagram showing the correction and measurement circuit of the direct conversion receiver in greater detail.

FIG. 3 is a block diagram showing the correction and measurement circuit 122 in greater detail. Within the correction and measurement circuit 122, a multiplexer and clock distributor 130 receives the calibration parameters from the adaptive calibration algorithm and distributes them within the circuit 122. The value of the calibration parameters is dependent upon the conversation frequency, $f_{RX}$, as well as time due to the iterative nature of the adaptive calibration as indicated by iteration indication variable, j. A summer 132 sums the I path digital samples, $Y_I[m]$, with a offset correction parameter, $R_{I-Offset}(j,f_{RX})$, as determined by an I-offset correction block 134 based upon the output of the multiplexer and clock distributor 130. The I-offset correction block 134 compensates for the DC offset and low frequency error in the I path.

The output of the summer 132 is coupled to a delay unit 136. The delay unit 136 adds a delay in the I path to compensate for the additional computational delays associated with the Q path so that the I and Q path exhibit the same overall delay. The output of the summer 132 is also coupled to a multiply unit 138 used to provide phase error correction as explained more fully below.

The output of the delay unit 136 comprises the corrected signal samples in standard mode, internal concurrent calibration mode and external concurrent calibration mode. In addition, in any one of the calibration modes the corrected signal samples, $U_I[k]$, comprise a corrected calibration signal. For example, Equation 1 below shows the relationship between the digital samples, $Y_I[m]$, and the corrected samples, $U_I[k]$.

$$U_I(k)=Y_I(m)+R_{I-Offset}(j,f_{RX}) \qquad \text{Eq. 1}$$

wherein:

$R_{I-Offset}(j, f_{RX})$ is the value of the j-th offset correction parameter for the in-phase path at the conversion frequency, $f_{RX}$.

The Q path digital samples, $Y_Q[m]$, are input into a summer 140. The summer 140 sums an offset correction parameter, $R_{Q\text{-}Offset}(j,f_{RX})$, to the Q path samples as determined by a Q-offset correction block 142 based upon the output of the multiplexer and clock distributor 130. The Q-offset correction block 142 compensates for the DC offset and low frequency error in the Q path.

The output of the summer 140 is multiplied by a Q path gain correction parameter, $R_{Q\text{-}Q}(j,f_{RX})$, in a multiply unit 144 as determined by the output of a gain imbalance correction unit 145 based upon the output of the multiplexer and clock generator 130. The multiply unit 144 compensates of gain imbalance between the I path and the Q path.

The multiply unit 138 multiples the corrected I path samples by a phase error correction parameter, $R_{I\text{-}Q}(j,f_{RX})$, as determined by the output of a phase correction block 139 based upon the output of the multiplexer and clock distributor 130. The output of the multiply unit 138 is summed with the output of the multiply unit 144 in a summer 146. The phase correction block 139, multiply unit 138 and summer 146 compensate for errors in the ideally 90 degree phase offset between the I path and the Q path. The resulting relationship between the digital samples, $Y_Q[m]$, and the corrected samples, $U_Q[k]$, is given below in Equation 2.

$$U_Q(k) = R_{Q\text{-}Q}(j,f_{RX})\{Y_Q(m) + R_{Q\text{-}Offset}(j,f_{RX})\} + R_{I\text{-}Q}(j,f_{RX})\{Y_I(m + R_{I\text{-}Offset}(j,f_{RX})\} \quad \text{Eq. 2}$$

wherein:

$R_{Q\text{-}Offset}(j,f_{RX})$ is the value of j-th offset correction parameter for the quadrature path at the conversion frequency, $f_{RX}$;

$R_{Q\text{-}Q}(j,f_{RX})$ is the value of the j-th quadrature path gain imbalance correction parameter at the conversion frequency, $f_{RX}$; and $R_{I\text{-}Q}(j,f_{RX})$ is the value of the j-th phase correction parameter at the conversion frequency, $f_{RX}$.

As noted above, the correction parameters are a function of the conversion frequency and are adaptive and thus change over time. This dependency on frequency and time is shown by the parenthetical following the correction parameters as shown in both Equations 1 and 2.

The output of the summer 146 comprises signal samples in standard mode and in concurrent internal and external calibration modes. In addition, during any of the calibration modes, the output of the summer 146 comprises a calibration signal at the down-converted baseband frequency, $f_{OBB}$.

Equations 3 and 4 provide a mathematical representation of the samples input to the in-phase and quadrature paths of the correction and measurement circuit 122.

$$Y_I[m] = \cos[2\pi f_{OBB} T_s m] + N_I(m) + \eta_I(m) \quad \text{Eq. 3}$$

$$Y_Q[m] = A\sin[2\pi f_{OBB} T_s m + \Delta] + N_Q(m) + \eta_Q(m) \quad \text{Eq. 4}$$

wherein:

$A$ is the gain of the Q channel normalized with respect to the I channel gain for calibration signal at $f_{RX}$;

$\Delta$ is the phase error of the quadrature path with respect to the I channel at frequency $f_{RX}$;

$N_I(m)$ is the I channel interference components which include quantized and filtered signals, interference, quantization noise, high frequency modulation products, and quantized thermal noise;

$N_Q(m)$ is the Q channel interference components which include quantized and filtered signals, interference, quantization noise, high frequency modulation products, and quantized thermal noise;

$\eta_I(m)$ is the I channel DC and low frequency noise;

$\eta_Q(m)$ is the Q channel DC and low frequency noise;

$T_s$ is the sample rate of $Y_I[m]$ and $Y_I[m]$; and $f_{OBB}$ is the translated calibration frequency, i.e. $[f_{OBB} = f_{TX} - f_{RX}]$.

In Equations 3 and 4 it is assumed, for simplicity, that the initial phase of the calibration signal at the input to the correction and measurement circuit 122 is zero. Substituting Equations 3 and 4 into Equations 1 and 2 respectively yields Equations 3A and 4A respectively:

$$U_I[k] = \cos[2\pi f_{OBB} T_s k] + N_I(k) + \eta_I(k) + R_{I\text{-}Offset}(j,f_{RX}) \quad \text{Eq. 3A}$$

$U_Q(k) =$ $R_{Q\text{-}Q}(j,f_{RX})\{A\sin[2\pi f_{OBB} T_s k + \Delta] + N_Q(k) +$ $\eta_Q(k) + R_{Q\text{-}Offset}(j,f_{RX})\} +$ $R_{I\text{-}Q}(j,f_{RX})\{\cos[2\pi f_{OBB} T_s k] + N_I(k) + \eta_I(k) +$ $R_{I\text{-}Offset}(j,f_{RX})\}$ $= R_{Q\text{-}Q}(j,f_{RX}) A\sin[2\pi f_{OBB} T_s k + \Delta] + R_{I\text{-}Q}(j,f_{RX})\{$ $\cos[2\pi f_{OBB} T_s k]$ $+ R_{Q\text{-}Q}(j,f_{RX})\{N_Q(k) + \eta_Q(k) + R_{Q\text{-}Offset}(j,f_{RX})\}$ $+ R_{I\text{-}Q}(j,f_{RX})\{N_I(k) + \eta_I(k) + R_{I\text{-}Offset}(j,f_{RX})\}$ $= R_{Q\text{-}Q}(j,f_{RX}) A\cos\Delta\sin[2\pi f_{OBB} T_s k] + \{R_{Q\text{-}Q}(j,f_{RX}) A$ $\sin\Delta +$ $R_{I\text{-}Q}(j,f_{RX})\}\cos[2\pi f_{OBB} T_s k]$ $+ R_{Q\text{-}Q}(j,f_{RX})\{N_Q(k) + \eta_Q(k) + R_{Q\text{-}Offset}(j,f_{RX})\}$ $+ R_{I\text{-}Q}(j,f_{RX})\{N_I(k) + \eta_I(k) + R_{I\text{-}Offset}$ $(j,f_{RX})\}$ Eq. 4A From Equations 3A and 4A, the I and Q paths are balanced with no quadrature error at $f_{RX}$ when $R_{Q\text{-}Q}(j,f_{RX})$ and $R_{I\text{-}Q}(j,f_{RX})$ are adjusted so that $R_{Q\text{-}Q}(j,f_{RX}) A\cos\Delta = 1$ and $R_{I\text{-}Q}(j,f_{RX}) = -R_{Q\text{-}Q}(j,f_{RX}) A\sin\Delta$. This adjustment is accomplished using the adaptation algorithm of the invention.

An I-offset measurement unit 148 receives the corrected samples, $U_I[k]$, as well as start and stop commands from the multiplexer and clock distributor 130 which determine the duration of the measurement. The I-offset measurement unit 148 filters the corrected samples using techniques well known in the art to produce a corresponding measurement parameter, $C_I(j,f_{RX})$, reflecting either the DC or low frequency offset or both found within the signal. The I-offset measurement unit 148 is shown in more detail in FIG. 4 and discussed more fully below.

Likewise, a Q-offset measurement unit 156 receives the Q path corrected samples, $U_Q[k]$, and start and stop commands from the multiplexer and clock distributor 130 in order to determine the corresponding measurement parameter, $C_Q(j, f_{RX})$ reflecting either the DC or low frequency offset or both found in the signal. The Q-offset measurement unit 156 is shown in more detail in FIG. 4 and discussed more fully below.

In contrast to the gain imbalance and phase correction calibration explained in more detail below, the DC and low frequency correction can be made both during calibration mode and during standard operation. Therefore, in one embodiment, the DC calibration functions performed by I-offset measurement unit 148 and Q-offset measurement unit 156 can continue to adapt independent of the mode of operation.

According to the known techniques, such as those disclosed in U.S. Pat. No. 5,604,929 entitled "System for Correcting Quadrature Gain and Phase Error in a Direct Conversion Single Sideband Receiver Independent of the Character of the Modulated Signal", one way to determine the amplitude of the calibration signal components of the corrected samples is to square the corrected samples. For example, squaring the corrected digital samples for the in-phase path, $U_I[k]$, generates a DC component having an amplitude proportional to the amplitude of the in-phase path calibration signal according to well known mathematical principles. However, such non-coherent detection also results in the generation of a series of DC components due to noise and interference present in the signals. The DC components corrupt the measurement made during the calibration process. Due to the noise component, such non-coherent measurement generates an inaccurate measurement of the amplitude of the calibration signal.

In contrast, the invention uses coherent measurement of the amplitude of the down-converted calibration signal. It would be ideal if the Q path corrected samples could be directly subtracted from the I path corrected samples. However, I path component of the calibration signal is approximately 90 degrees out of phase with the Q path component. For example, if the I path component comprises a cosine term, the Q path component comprises a sine term. Thus, the I path and Q path components amplitudes cannot be directly subtracted from one another.

In order to perform coherent adaptive calibration, the I path channel samples, $U_I(k)$, are multiplied by a cosine wave (or square wave having an equivalent phase relationship) having a frequency $f_\lambda$ which is approximately, but not exactly, equal to the baseband frequency of the down-converted calibration signal, $f_{OBB}$. In addition, the Q path corrected samples, $U_Q(k)$, are multiplied by a sine wave (or square wave having an equivalent phase relationship) at frequency $f_\lambda$. A calibration reference generator 152 generates the measurement reference waveforms at frequency $f_\lambda$ determined by a parameter received from the multiplexer and clock distributor 130.

Both the I path corrected samples, $U_I[k]$, and the Q path corrected samples, $U_Q[k]$, are coupled to an I/Q gain imbalance measurement unit 150. The I/Q gain imbalance measurement unit 150 aids in determining the relative amplitude of I and Q paths by examination of the I path calibration signal amplitude and the Q path calibration signal amplitude using the sinusoidal signals generated by the calibration reference generator 152 and start and stop commands from the multiplexer and clock distributor 130. The I/Q gain imbalance measurement unit 150 is shown in more detail in FIG. 4 and discussed more fully below.

Likewise, a phase error measurement unit 154 receives the Q path corrected samples, $U_Q[k]$, and start and stop commands from the multiplexer and clock distributor 130 using the sinusoidal signals generated by the calibration reference generator 152. The quadrature error measurement unit 154 is shown in more detail in FIG. 4 and discussed more fully below.

Figure 4:
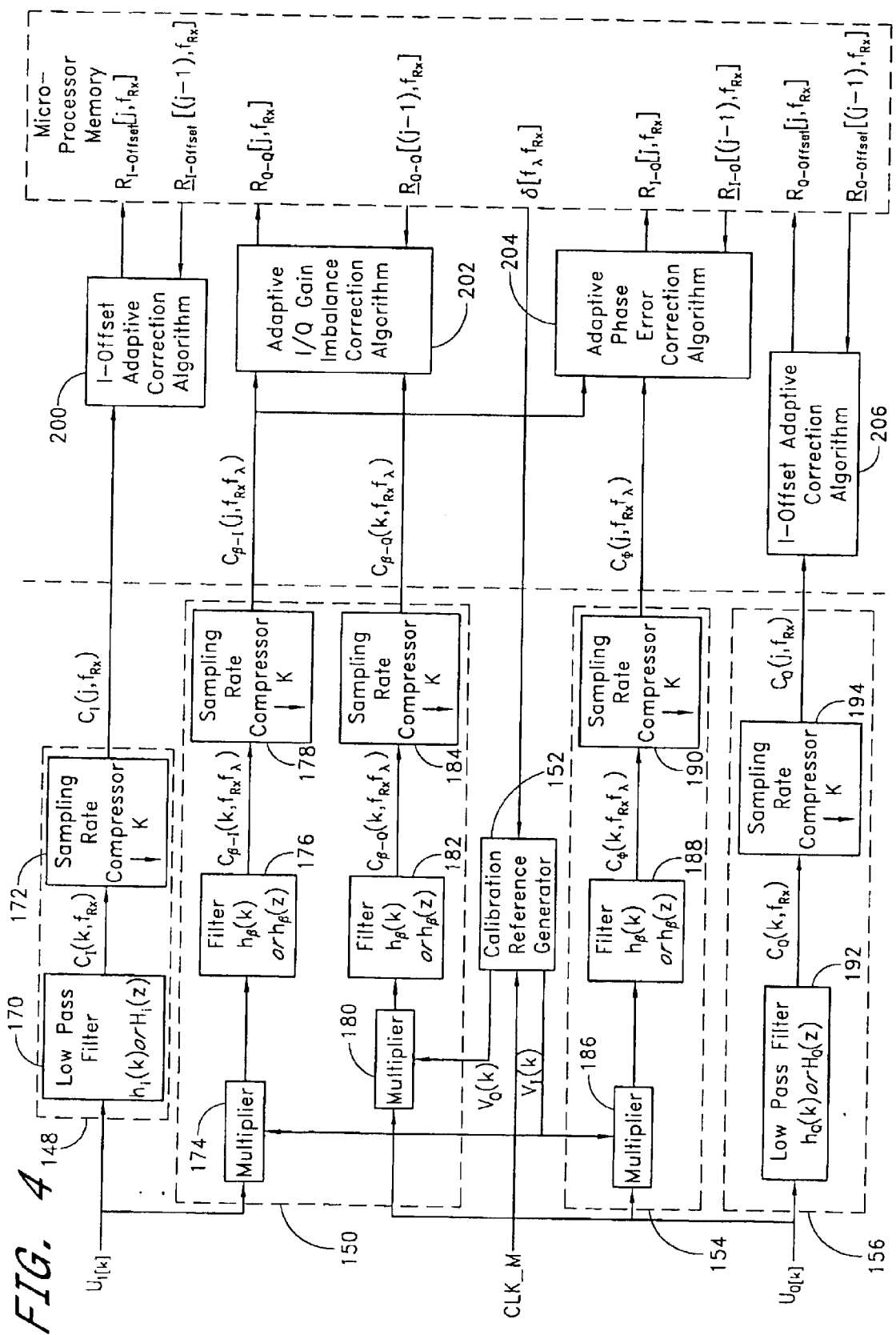
FIG. 4 is a block diagram showing a portion of the measurement circuit and a portion of the functions carried out by the digital processor.

As illustrated in FIG. 4, the I-offset measurement unit 148 is shown to comprise a digital filter 170 and a sample rate compressor 172. Equation 5 expresses mathematically the relationship between the I path channel samples, $U_I[k]$, input into the I-offset measurement unit 148 and the measurement parameter, $C_I[j,f_{RX}]$, output by the I-offset measurement unit 148.

$$C_I[j, f_{RX}] = \sum_{k=K \cdot (j-1)}^{K \cdot j} h_I(K \cdot j - k)\{U_I[k]\} \quad \text{Eq. 5}$$

where:

$h_I(k)$ is the unit sample response of the digital low pass filter 170; and

K is the number of samples used in measurement by the sample rate compressor 172.

The output of the I-offset measurement unit 148 is input into an I-offset adaptive correction algorithm 200 which, in one embodiment, implements a stochastic gradient algorithm where the delay constant and the correction gain constant are tailored to the receiver noise figure. In addition, the gain constant can be a function of time or the measured error magnitude. Further information concerning stochastic gradient algorithms can be found in J. G. Proakis et al., *Advanced Digital Signal Processing*, pp. 341–350, (Macmillan Publishing Co., New York (1992).) Equation 6 below expresses mathematically the operation carried out by the I-offset adaptive correction algorithm 200 to determine the next value of the offset correction parameter, $R_{I-Offset}[j, f_{RX}]$.

$$R_{I-Offset}[j,f_{RX}] = \rho_{dc} R_{I-Offset}[(j-1),f_{RX}] + \alpha_{dc} C_I[j,f_{RX}] \quad \text{Eq. 6}$$

where:

$\rho_{dc}$ is a delay constant; and $\alpha_{dc}$ is a correction gain term.

The I/Q gain imbalance measurement unit 150 comprises a multiplier 174, a digital filter 176 and a sample rate compressor 178. Within the I/Q gain imbalance measurement unit 150, Equation 7 expresses mathematically the relationship between the I path channel samples, $U_I[k]$, input into the I/Q gain imbalance measurement unit 150 and the measurement, parameter, $C_{\beta-I}[j,f_{RX},f_\lambda]$, output by the I/Q gain imbalance measurement unit 150.

$$C_{\beta-I}[j, f_{RX}, f_\lambda] = \sum_{k=K \cdot (j-1)}^{K \cdot j} h_\beta(K \cdot j - k)\{V_I(k)U_I[k]\} \quad \text{Eq. 7}$$

where:

$h_\beta(k)$ is the unit sample response of the digital filter 176;

K is the number of samples used in measurement; and $V_I(k)$ is the cosine wave measurement reference signal.

The I/Q gain imbalance measurement unit 150 is also shown to comprise a multiplier 180, a digital filter 182 and a sample rate compressor 184. Equation 8 expresses mathematically the relationship between the Q path channel samples, $U_Q[k]$, input into the I/Q gain imbalance measurement unit 150 and the measurement parameter, $C_{\beta-Q}[j,f_{RX},f_\lambda]$, output by the I/Q gain imbalance measurement unit 150.

$$C_{\beta-Q}[j, f_{RX}, f_\lambda] = \sum_{k=K \cdot (j-1)}^{K \cdot j} h_\beta(K \cdot j - k)\{V_Q(k)U_Q[k]\} \quad \text{Eq. 8}$$

where:

$h_\beta(k)$ is the unit sample response of the digital filter 182;

K is the number of samples used in measurement; and $V_Q(k)$ is the sine wave measurement reference signal.

Applying the equations developed above for $U_I[k]$, Equation 9 illustrates mathematically, the operation carried out by the multiplier 174. The multiplier 174 multiples the value of $U_I[k]$, as defined by Equation 3A, by the cosine wave at $f_\lambda$ output by the calibration reference generator 152. Likewise, applying the equations developed above for $U_Q[k]$, Equation 10 illustrates mathematically the operation carried out by the multiplier 180. The multiplier 180 multiplies the value of $U_Q[k]$, as defined by equation 4A, by a sine wave at $f_\lambda$ output by the calibration reference generator 152.

$$\cos[2\pi f_\lambda T_s k]U_I[k]$$

$$= \cos[2\pi f_\lambda T_s k]\{\cos[2\pi f_{OBB}T_s k] + N_I(k) + \eta_I(k) + R_{I\text{-}Offset}(j,f_{RX})\}$$

$$= \tfrac{1}{2}\cos[2\pi(f_\lambda - f_{OBB})T_s k]$$

$$+ \tfrac{1}{2}\cos[2\pi(f_\lambda + f_{OBB})T_s k] + N_I(k)\cos[2\pi f_\lambda T_s k]$$

$$+ \{\eta_I(k) + R_{I\text{-}Offset}(j,f_{RX})\}\cos[2\pi f_\lambda T_s k] \quad \text{Eq. 9}$$

$$\sin[2\pi f_\lambda T_s k]U_Q[k]$$

$$= R_{Q\text{-}Q}(j,f_{RX})A\cos\Delta \sin[2\pi f_\lambda T_s k]\sin[2\pi f_{OBB}T_s k]$$

$$+ \{R_{Q\text{-}Q}(j,f_{RX})A\sin\Delta + R_{I\text{-}Q}(j,f_{RX})\}\cos[2\pi f_{OBB}T_s k]$$

$$\sin[2\pi f_\lambda T_s k]$$

$$+ \{R_{Q\text{-}Q}(j,f_{RX})N_Q(k) + R_{I\text{-}Q}(j,f_{RX})N_I(k)\}\sin[2\pi f_\lambda T_s k]$$

$$+ \{[\eta_Q(k) + R_{Q\text{-}Offset}(j,f_{RX})] + [\eta_I(k) + R_{I\text{-}Offset}(j,f_{RX})]\}\sin[2\pi f_\lambda T_s k]$$

$$= \tfrac{1}{2}R_{Q\text{-}Q}(j,f_{RX})A\cos\Delta\{\cos[2\pi(f_\lambda - f_{OBB})T_s k]$$

$$- \cos[2\pi(f_\lambda + f_{OBB})T_s k]\}$$

$$+ \tfrac{1}{2}\{R_{Q\text{-}Q}(j,f_{RX})A\sin\Delta + R_{I\text{-}Q}(j,f_{RX})\}\{\sin[2\pi(f_\lambda - f_{OBB})T_s k]$$

$$+ \sin[2\pi(f_\lambda + f_{OBB})T_s k]\}$$

$$+ \{R_{Q\text{-}Q}(j,f_{RX})N_Q(k) + R_{I\text{-}Q}(j,f_{RX})N_I(k)\}\sin[2\pi f_\lambda T_s k]$$

$$+ \{[\eta_Q(k) + R_{Q\text{-}Offset}(j,f_{RX})] + [\eta_I(k) + R_{I\text{-}Offset}(j,f_{RX})]\}\sin[2\pi f_\lambda T_s k] \quad \text{Eq. 10}$$

As shown mathematically by Equation 9A below, the filter 176 filters the terms having a frequency greater than $f_\lambda - f_{OBB}$ which are output by the multiplier 174. As shown mathematically by Equation 10A below, the digital filter 182 filters out the terms having a frequency greater than $f_\lambda - f_{OBB}$ which are output by the multiplier 180.

$$\text{Filtered }\{\cos[2\pi f_\lambda T_s k]U_I[k]\} = \tfrac{1}{2}\cos[2\pi(f_\lambda - f_{OBB})T_s k] + \xi_I(k) \quad \text{Eq. 9A}$$

$$\text{Filtered }\{\sin[2\pi f_\lambda T_s k]U_Q[k]\}$$

$$= \tfrac{1}{2}R_{Q\text{-}Q}(j,f_{RX})A\cos\Delta\{\cos[2\pi(f_\lambda - f_{OBB})T_s k]$$

$$+ \tfrac{1}{2}\{R_{Q\text{-}Q}(j,f_{RX})A\sin\Delta + R_{I\text{-}Q}(j,f_{RX})\}\sin[2\pi(f_\lambda - f_{OBB})T_s k] + \xi_Q(k) \quad \text{Eq. 10A}$$

wherein:

$\xi_I(k)$ is the residual noise after the filtering by the filter 176; and $\xi_Q(k)$ is the residual noise after the filtering by the filter 182.

The residual noise components can be further reduced by additional bandpass filtering centered at $|f_\lambda - f_{OBB}|$. Note that because the DC and low frequency contribution has been translated up to frequency $f_\lambda$, it is effectively eliminated by filtering according to well known techniques. Thus, this process allows the I and Q imbalance correction parameter to be determined independent of the effectiveness of the DC and low frequency offset correction.

The output of the filter 176 is decimated in the sampling rate compressor 178 and coupled to an adaptive I-Q imbalance correction algorithm 202. Likewise, the output of the filter 182 is decimated in the sampling rate compressor 178 and coupled to the adaptive I-Q imbalance correction algorithm 202. The adaptive I-Q imbalance correction algorithm 202, in one embodiment, implements a stochastic gradient algorithm as described above. Equation 11 below expresses mathematically the operation carried out by the adaptive I-Q imbalance correction algorithm 202 to determine the next value of the correction parameter, $R_{Q\text{-}Q}(j,f_{RX})$.

$$R_{Q\text{-}Q}(j,f_{RX},f_\lambda) = \rho_\beta R_{Q\text{-}Q}[(j-1),f_{RX},f_\lambda] + \alpha_\beta\{[C_{\beta\text{-}I}(j,f_{RX},f_\lambda) - C_{\beta\text{-}Q}(j,f_{RX},f_\lambda)]C_{\beta\text{-}I}(j,f_{RX},f_\lambda)\} \quad \text{Eq. 11}$$

where:

$C_{\beta\text{-}I}(j,f_{RX},f_\lambda)$ is the output of the sample rate compressor 178;

$C_{\beta\text{-}Q}(j,f_{RX},f_\lambda)$ is the output of the sample rate compressor 184;

$\rho_\beta$ is a decay constant and the $|\rho_\beta| < 1$; and $\alpha_\beta$ is a correction gain term.

In Equation 11, the correction signal is the product of the difference, the term $[C_{\beta\text{-}I}(j,f_{RX},f_\lambda) - C_{\beta\text{-}Q}(j,f_{RX},f_\lambda)]$ and the term $C_{\beta\text{-}I}(j,f_{RX},f_\lambda)$ where both contain components due to the calibration signal at the frequency $[f_{OBB} - f_\lambda]$. By choosing $f_{OBB}$ and $f_\lambda$ so that $[f_{OBB} - f_\lambda]$ is close to zero, the low pass filters 178 and 182 will only pass the calibration signal components at the frequency $[f_{OBB} - f_\lambda]$ and narrowband thermal noise. The resultant product contains components at DC and $2[f_{OBB} - f_\lambda]$ that are proportional to the imbalance error plus some corruption of the DC term due to the residual narrowband thermal noise. This correction signal is further filtered by the adaptive I-Q imbalance correction algorithm 202 according to Equation 11, if the iteration rate and decay constant are selected so as to reject the component at the frequency of $2[f_{OBB} - f_\lambda]$. This adaptive I-Q balance correction approach effectively implements a narrow bandpass filter around $[f_{OBB} - f_\lambda]$ which represents an offset from the region around zero frequency, thereby ameliorating the effects of DC offset and low frequency corruption of the input signals $U_I[k]$ and $U_Q[k]$. For example, Equation 12 given below expands the term $\{[C_{\beta\text{-}I}(j,f_{RX},f_\lambda) - C_{\beta\text{-}Q}(j,f_{RX},f_\lambda)]C_{\beta\text{-}I}(j,f_{RX},f_\lambda)\}$ to illustrate the bandpass nature of the operation performed by the adaptive I-Q imbalance correction algorithm 202.

$$C_{\beta\text{-}I}(j, f_{RX}, f_\lambda)\{C_{\beta\text{-}I}(j, f_{RX}, f_\lambda) - C_{\beta\text{-}Q}(j, f_{RX}, f_\lambda)\} = \quad \text{Eq. 12}$$

$$\text{Filtered}\{\cos[2\pi f_\lambda T_s k]\}U_I[k]\}\{\text{Filtered}\{\cos[2\pi f_\lambda T_s k]U_I[k]\} - \text{Filtered}\{\sin[2\pi f_\lambda T_s k]U_Q[k]\} =$$

$$\frac{1}{8}[1 - R_{Q\text{-}Q}(j, f_{RX})A\cos\Delta]\{1 + 1\cos[4\pi(f_\lambda - f_{OBB})T_s k] + 2\xi_I(k)\cos[2\pi(f_\lambda - f_{OBB})T_s k] + 8[\xi_I(k)]^2\} -$$

$$\frac{1}{8}[R_{Q\text{-}Q}(j, f_{RX})A\sin\Delta + R_{I\text{-}Q}(j, f_{RX})]\{\sin[4\pi(f_\lambda - f_{OBB})T_s k] + 4\xi_Q(k)\cos[2\pi(f_\lambda - f_{OBB})T_s k]\} -$$

$$\frac{1}{8}\xi_I(k)\{4R_{Q\text{-}Q}(j, f_{RX})A\cos\Delta\cos[2\pi(f_\lambda - f_{OBB})T_s k] + 4[R_{Q\text{-}Q}(j, f_{RX})A\sin\Delta + R_{I\text{-}Q}(j, f_{RX})]$$

$$[\sin[2\pi(f_\lambda - f_{OBB})T_s k]\} + \xi_I(k)\xi_Q(k)\}$$

Observing that the residual noise after the filtering by the filter 176, $\xi_I(k)$, is uncorrelated with the residual noise after the filtering by the filter 182, $\xi_Q(k)$, low pass filtering can eliminate all but the DC term and the low frequency portion of $[\xi_I(k)]^2$ as reflected in Equation 12A below.

$$\text{Filtered}[C_{\beta\text{-}I}(j,f_{RX},f_\lambda)\{C_{\beta\text{-}I}(j,f_{RX},f_\lambda)\text{-}C_{\beta\text{-}Q}(j,f_{RX},f_\lambda)\}] = \frac{1}{8}[1 - R_{Q\text{-}Q}(j, f_{RX})A\cos\Delta]\text{Filtered}\{[\xi_I(k)]^2\} \quad \text{Eq. 12A}$$

Thus, balance is derived when $R_{Q\text{-}Q}(j,f_{RX})A\cos\Delta = 1$ as limited by the value of Filtered $[\xi_I(k)]^2$.

The quadrature error measurement unit 154 is shown to comprise a multiplier 186, a digital filter 188 and a sample rate compressor 190. Equation 13 expresses mathematically the relationship between the Q path channel samples, $U_Q[k]$, input into the quadrature error measurement unit 154 and the measurement parameter, $C_\phi[j,f_{RX},f_\lambda]$, output by the quadrature error measurement unit 154.

$$C_\phi[j, f_{RX}, f_\lambda] = \sum_{k=K\cdot(j-1)}^{K\cdot j} h_\phi(K\cdot j - k)\{V_I(k)U_Q[k]\} \quad \text{Eq. 13}$$

where:
  $h_\phi(k)$ is the unit sample response of the digital filter 188; and
  K is the number of samples used in the measurement.

Applying the equations developed above for $U_Q[k]$, Equation 14 illustrates mathematically, the operation carried out by the multiplier 186. The multiplier 186 multiples the values of $U_Q[k]$, as defined by Equation 4A by the cosine wave at $f_\lambda$ output by the calibration reference generator 152.

$$\cos[2\pi f_\lambda T_s k]U_Q[k]$$

$$= R_{Q\text{-}Q}(j,f_{RX})A\cos\Delta\cos[2\pi f_\lambda T_s k]\sin[2\pi f_{OBB}T_s k]$$

$$+ \{R_{Q\text{-}Q}(j,f_{RX})A\sin\Delta + R_{I\text{-}Q}(j,f_{RX})\}\cos[2\pi f_{OBB}T_s k]$$

$$\cos[2\pi f_\lambda T_s k]$$

$$+ R_{Q\text{-}Q}(j,f_{RX})N_Q(k) + R_{I\text{-}Q}(j,f_{RX})N_Q(k)\}\cos[2\pi f_\lambda T_s k]$$

$$+ \{[\eta_Q(k) + R_{Q\text{-}Offset}(j,f_{RX})] + \eta_I(k) + R_{I\text{-}Offset}(j,f_{RX})]\}\cos[2\pi f_\lambda T_s k]$$

$$= \frac{1}{2}R_{Q\text{-}Q}(j,f_{RX})A\cos\Delta\{-\sin[2\pi(f_\lambda - f_{OBB})T_s k]$$

$$+ \sin[2\pi(f_\lambda + f_{OBB})T_s k]\}$$

$$+ \frac{1}{2}\{R_{Q\text{-}Q}(j,f_{RX})A\sin\Delta + R_{I\text{-}Q}(j,f_{RX})\}\{\cos[2\pi(f_\lambda - f_{OBB})T_s k]$$

$$+ \cos[2\pi(f_\lambda - f_{OBB})T_s k]\}$$

$$+ \{R_{Q\text{-}Q}(j,f_{RX})N_Q(k) + R_{I\text{-}Q}(j,f_{RX})N_I(k)\}\cos[2\pi f_\lambda T_s k]$$

$$+ \{[\eta_Q(k) + R_{Q\text{-}Offset}(j,f_{RX})] + [\eta_I(k) + R_{I\text{-}Offset}(j,f_{RX})]\}\cos[2\pi f_\lambda T_s k] \quad \text{Eq. 14}$$

The filter 188 filters the terms having a frequency greater than $f_\lambda - f_{OBB}$ which are output by the multiplier 186 as shown mathematically by Equation 14A below.

$$C_\phi(j,f_{RX},f_\lambda) = -\frac{1}{2}R_{Q\text{-}Q}(j,f_{RX})A\cos\Delta\sin[2\pi(f_\lambda - f_{OBB})T_s k]$$

$$+ \frac{1}{2}\{R_{Q\text{-}Q}(j,f_{RX})A\sin\Delta + R_{I\text{-}Q}(j,f_{RX})\}\cos[2\pi(f_\lambda - f_{OBB})T_s k] + \xi_\phi(k) \quad \text{Eq. 14A}$$

wherein
  $\xi_\phi(k)$ is the residual noise after the filtering with filter 188.

The residual noise components can be further reduced by additional bandpass filtering centered at $|f_\lambda - f_{OBB}|$. Note that because the DC and low frequency contribution has been translated up to frequency $f_\lambda$, it is effectively eliminated by filtering according to well known techniques. Thus, this process allows the phase error correction parameter to be determined independent of the effectiveness of the DC and low frequency offset correction.

The output of the sampling rate compressor 178 is coupled to the adaptive phase error correction algorithm 204. The adaptive phase error correction algorithm 204, in one embodiment, implements a stochastic gradient algorithm as described above. Equation 15 below expresses mathematically the operation carried out by the adaptive phase error correction algorithm 204 to determine the next value of the correction parameter, $R_{I\text{-}Q}(j,f_{RX})$.

$$R_{I\text{-}Q}[j,f_{RX},f_\lambda] = \rho_\phi R_{I\text{-}Q}[(j-1),f_{RX},f_\lambda] + \alpha_\phi C_{\beta\text{-}I}(j,f_{RX},f_\lambda)C_\phi(j,f_{RX},f_\lambda)) \quad \text{Eq. 15}$$

where:
  $\rho_\phi$ is a decay constant and $|\rho_\phi| < 1$; and
  $\alpha_\phi$ is a correction gain term.

In Equation 15, the correction signal is the product of the term $[C_{\beta\text{-}Q}(j,f_{RX},f_\lambda)]$ and the term $C_{\beta\text{-}I}(j,f_{RX},f_\lambda)$ where both contain components component due to the calibration signal at the frequency $[f_{OBB} - f_\lambda]$. The resultant product contains components at DC and $2[f_{OBB} - f_\lambda]$ that are proportional to the quadrature error plus some corruption of the DC term due to the residual narrowband thermal noise. This correction signal is further filtered by Equation 15, if the iteration rate and decay constant are selected so as to reject the component at the frequency of $2[f_{OBB} - f_\lambda]$. This approach effectively implements a narrow bandpass filter around $[f_{OBB}-f_\lambda]$ which represents an offset the region around zero frequency thereby ameliorating the effects of DC offset and low frequency corruption of the input signals $U_I(k)$ and $U_Q(k)$. For example, Equation 16 given below expands the term $\{C_\phi(j,f_{RX},f_\lambda)C_{\beta-I}(j,f_{RX},f_\lambda)\}$ to illustrate the bandpass nature of the operation performed by the adaptive phase error correction algorithm 204.

$$C_\phi(j,f_{RX},f_\lambda)C_{\beta-I}(j,f_{RX},f_\lambda)=$$
$$\{\tfrac{1}{2}\cos[2\pi(f_\lambda-f_{OBB})T_s k]+\xi_I(k)\}$$
$$\{-\tfrac{1}{2}R_{Q-Q}(j,f_{RX})A\cos\Delta\sin[2\pi(f_\lambda-f_{OBB})T_s k]$$
$$+\tfrac{1}{2}\{R_{Q-Q}(j,f_{RX})A\sin\Delta+R_{I-Q}(j,f_{RX})\}\cos[2\pi(f_\lambda-f_{OBB})T_s k]+\xi_\phi(k)\}$$
$$=\tfrac{1}{8}\{[R_{Q-Q}(j,f_{RX})A\sin\Delta R_{I-Q}(j,f_{RX})]+R_{Q-Q}(j,f_{RX})A\cos\Delta\sin[4\pi(f_\lambda-f_{OBB})T_s k]$$
$$+[R_{Q-Q}(j,f_{RX})A\sin\Delta+R_{I-Q}(j,f_{RX})]\cos[4\pi(f_\lambda-f_{OBB})T_s k]+4\xi_\phi(k)\cos[2\pi(f_\lambda-f_{OBB})T_s k]\}$$
$$+\xi_I(k)\{-\tfrac{1}{2}R_{Q-Q}(j,f_{RX})A\cos\Delta\sin[2\pi(f_\lambda-f_{OBB})T_s k]$$
$$+\tfrac{1}{2}\{R_{Q-Q}(j,f_{RX})A\sin\Delta+R_{I-Q}(j,f_{RX})\}\cos[2\pi(f_\lambda-f_{OBB})T_s k]\}$$
$$+\xi_I(k)\xi_\phi(k) \qquad \text{Eq. 16}$$

Observing that the residual noise after the filtering by the filter 188, $\xi_N(k)$, is uncorrelated with the residual noise after the filtering by the filter 176, $\xi_I(k)$, Equation 16 reduces to Equation 16A given below.

$$\text{Filtered}[C_\phi(j,f_{RX},f_\lambda)C_{\beta-I}(j,f_{RX},f_\lambda)]=\tfrac{1}{8}\{[R_{Q-Q}(j,f_{RX})A\sin\Delta+R_{I-Q}(j,f_{RX})] \qquad \text{Eq. 16A}$$

Thus, the adaptive phase error correction algorithm 204 adjusts the next value of. $R_{I-Q}(j,f_{RX})$ such that $R_{I-Q}(j,f_{RX})=-R_{Q-Q}(j,f_{RX})A\sin\Delta$.

The Q-offset measurement unit 156 comprises a digital filter 192 and a sample rate compressor 194. Equation 17 expresses mathematically the relationship between the Q path channel samples, $U_Q[k]$, input into the Q-offset measurement unlit 156 and the measurement parameter, $C_Q[j,f_{RX}]$, output by the Q-offset measurement unit 156.

$$C_Q[j,f_{RX}]=\sum_{k=K\cdot(j-1)}^{K\cdot j} h_Q(K\cdot j-k)\{U_Q[k]\} \qquad \text{Eq. 17}$$

where:

$h_Q(k)$ is the unit sample response of the digital filter 192; and

K is the number of samples used in measurement by the sample rate compressor 194.

The output of the Q-offset measurement unit 156 is input into a Q-offset adaptive correction algorithm 206 which, in one embodiment, implements a stochastic gradient algorithm as described above. Equation 18 below expresses mathematically the operation carried out by the Q-offset adaptive correction algorithm 206 to determine the next value of the correction parameter, $R_{Q-\text{Offset}}(j,f_{RX})$.

$$R_{Q-\text{Offset}}(j,f_{RX})=\rho_{dc}R_{Q-\text{Offset}}((j-1),f_{RX})+\alpha_{dc}C_Q(j,f_{RX}) \qquad \text{Eq. 18}$$

where:

$\rho_{dc}$ is a delay constant; and $\alpha_{dc}$ is a correction gain term.

Figure 5:
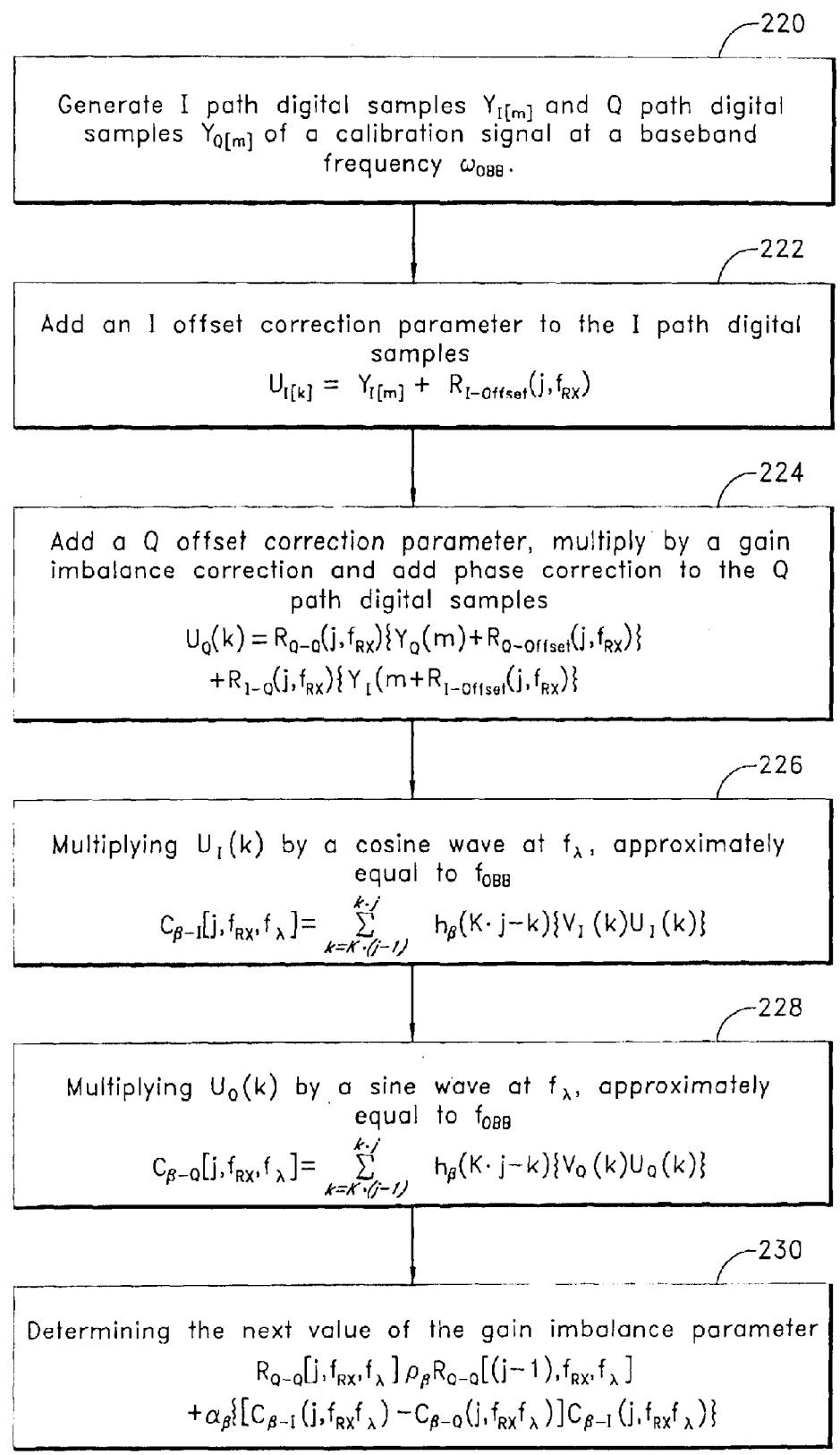
FIG. 5 is a flow chart for determining the gain imbalance parameter.

FIG. 5 is a flow chart showing one embodiment of the invention. In block 220, a set of I path digital samples, $Y_I[m]$, and Q path digital samples, $Y_Q[m]$, of a calibration signal at a baseband frequency $f_{OBB}$ are generated. In block 222, an I offset correction parameter is added to the I path digital samples. In block 224, a Q offset correction parameter is added to the Q path digital samples. This total is multiplied by a gain imbalance correction parameter and a phase error correction parameter is added to the result. In block 226, the corrected I path samples are multiplied by a cosine wave at $f_\lambda$ and the result is filtered and subsampled. In block 228, the corrected Q path samples are multiplied by a sine wave at $f_\lambda$ and the result is filtered and subsampled. In block 230, the next value of the gain imbalance parameter is determined based upon the previous value and the results of block 226 and 228.

Figure 6:
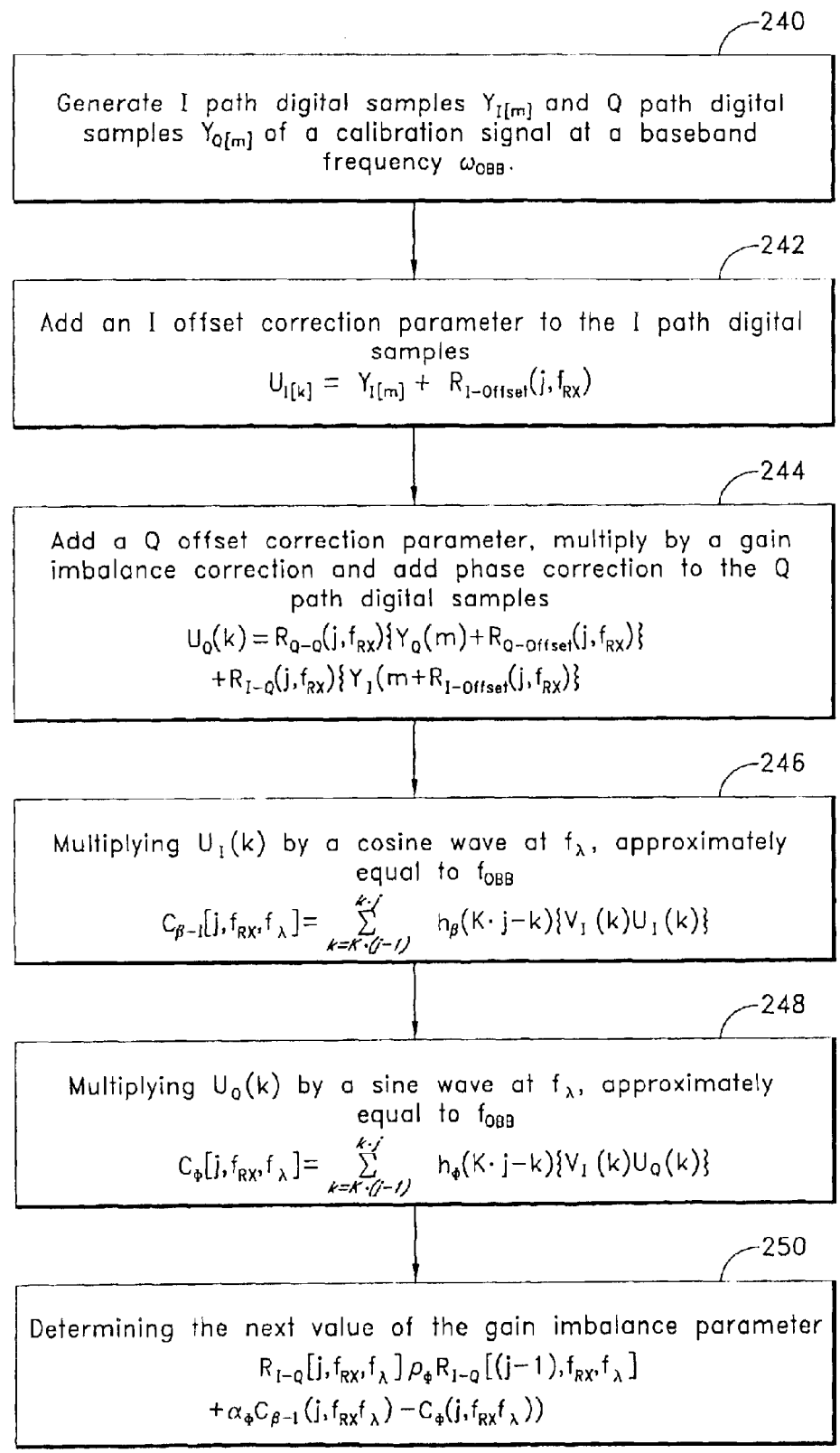
FIG. 6 is a flow chart for determining a phase offset error parameter.

FIG. 6 is a flowchart showing a second embodiment of the invention which may be combined with the embodiment shown in FIG. 5 or used separately. In block 240, a set of I path digital samples, $Y_I[m]$, and Q path digital samples, $Y_Q[m]$, of a calibration signal at a baseband frequency $f_{OBB}$ are generated. In block 242, an I offset correction parameter is added to the I path digital samples. In block 244, a Q offset correction parameter is added to the Q path digital samples. This total is multiplied by a gain imbalance correction parameter and a phase error correction parameter is added to the result. In block 246, the corrected I path samples are multiplied by a cosine wave at $f_\lambda$ and the result is filtered and subsampled. In block 248, the corrected Q path samples are multiplied by a cosine wave at $f_\lambda$ and the result is filtered and subsampled. In block 250, the next value of the gain imbalance parameter is determined based upon the previous value and the results of block 226 and 228.

The functional blocks and method steps described herein can be distributed in a variety of media. In one embodiment, a general purpose microprocessor executing software code is used to implement all or a portion of the functions. Alternatively, some or all of the functions can be implemented in an application specific integrated circuit (ASIC), with discrete hardware components or in software or firmware. The functions of the I channel and Q channel function can be reversed so long as the two channels are orthogonal to one another.

The invention may be embodied in other specific forms without departing from its spirit or essential characteristics. The described embodiment is to be considered in all respects only as illustrative and not restrictive and the scope of the invention is, therefore, indicated by the appended claims rather than the foregoing description. All changes which come within the meaning and range of equivalency of the claims are to be embraced within their scope.

| Generate $I$ path digital samples $Y_I[m]$ and $Q$ path digital samples $Y_Q[m]$ of a calibration signal at a baseband frequency $T_{OBB}$. | 220 |

| Add an $I$ offset correction parameter to the $I$ path digital samples $U_I(k) = Y_I(m) + R_{I-\text{Offset}}(j, f_{RX})$ | 222 |

-continued

| 224 | Add a $Q$ offset correction parameter, multiply by a gain imbalance correction and add phase correction to the $Q$ path digital samples $U_Q(k) = R_{Q-Q}(j, f_{RX})\{Y_Q(m) + R_{Q-Offset}(j, f_{RX})\} + R_{I-Q}(j, f_{RX})\{Y_I(m + R_{I-Offset}(j, f_{RX})\}$ |

| 226 | Multiplying $U_I(k)$ by a cosine wave at $f_\lambda$, approximately equal to $f_{OBB}$ $C_{\beta-I}[j, f_{RX}, f_\lambda] = \sum_{k=K\cdot(j-1)}^{K\cdot j} h_\beta(K\cdot j - k)\{V_I(k)U_I(k)\}$ |

| 228 | Multiplying $U_Q(k)$ by a sine wave at $f_\lambda$, approximately equal to $f_{OBB}$ $C_{\beta-Q}[j, f_{RX}, f_\lambda] = \sum_{k=K\cdot(j-1)}^{K\cdot j} h_\beta(K\cdot j - k)\{V_Q(k)U_Q(k)\}$ |

| 230 | Determining the next value of the imbalance parameter $R_{Q-Q}[j, f_{RX}, f_\lambda] = \rho_\beta R_{Q-Q}[(j-1), f_{RX}, f_\lambda] + \alpha_\beta\{[C_{\beta-I}(j, f_{RX}, f_\lambda) - C_{\beta-Q}(j, f_{RX}, f_\lambda)]C_{\beta-I}(j, f_{RX}, f_\lambda)\}$ |

| 240 | Generate $I$ path digital samples $Y_I[m]$ and $Q$ path digital samples $Y_Q[m]$ of a calibration signal at a baseband frequency $T_{OBB}$. |

| 242 | Add an $I$ offset correction parameter to the $I$ path digital samples $U_I(k) = Y_I(m) + R_{I-Offset}(j, f_{RX})$ |

| 244 | Add a $Q$ offset correction parameter, multiply by a gain imbalance correction and add phase correction to the $Q$ path digital samples $U_Q(k) = R_{Q-Q}(j, f_{RX})\{Y_Q(m) + R_{Q-Offset}(j, f_{RX})\} + R_{I-Q}(j, f_{RX})\{Y_I(m + R_{I-Offset}(j, f_{RX})\}$ |

| 246 | Multiplying $U_I(k)$ by a cosine wave at $f_\lambda$, approximately equal to $f_{OBB}$ $C_{\beta-I}[j, f_{RX}, f_\lambda] = \sum_{k=K\cdot(j-1)}^{K\cdot j} h_\beta(K\cdot j - k)\{V_I(k)U_I(k)\}$ |

| 248 | Multiplying $U_Q(k)$ by a cosine wave at $f_\lambda$, approximately equal to $f_{OBB}$ $C_\phi[j, f_{RX}, f_\lambda] = \sum_{k=K\cdot(j-1)}^{K\cdot j} h_\phi(K\cdot j - k)\{V_I(k)U_Q(k)\}$ |

| 250 | Determining the next value of phase correction parameter $R_{I-Q}[j, f_{RX}, f_\lambda] = \rho_\phi R_{I-Q}[(j-1), f_{RX}, f_\lambda] + \alpha_\phi C_{\beta-I}(j, f_{RX}, f_\lambda)C_\phi(j, f_{RX}, f_\lambda))$ |

What is claimed is:

1. A coherent adaptive calibration method for a receiver, comprising:
removing at least a portion of a DC offset from a series of first channel signal samples to produce a series of corrected first channel samples;
computing a linear combination of said series of corrected first channel samples and a series of second channel signal samples to produce a series of corrected second channel samples, wherein parameters for said linear combination are computed at least in part from a gain imbalance correction parameter and a phase correction parameter;
down-converting said series of corrected first channel samples to produce a first in-phase down-converted signal;
down-converting said series of corrected second channel samples to produce a quadrature down-converted signal; and
determining a next value of said gain imbalance correction parameter based upon at least said first in-phase down-converted signal and said quadrature down-converted signal.

2. The method of claim 1, wherein said linear combination of said series of corrected first channel samples an series of second channel signal samples comprises multiplying said series of first channel signal samples by said phase correction parameter.

3. The method of claim 1 wherein said linear combination of said series of corrected first channel samples and said series of second channel signal samples comprises adding an offset to remove at least a portion of a DC offset of said series of second channel signal samples.

4. The method of claim 1, wherein said linear combination of said series of corrected first channel samples and said series of second channel signal samples comprises adding an offset to remove at least a portion of a DC offset of said series of second channel signal samples to produce offset samples, multiplying said offset samples by said gain imbalance correction parameter, and multiplying said series of corrected first channel samples by said phase correction parameter.

5. The method of claim 1, wherein said determining a next value of said gain imbalance correction parameter comprises a ratio corresponding to said first in-phase down-converted signal and said quadrature down-converted signal.

6. The method of claim 1 wherein the series of channel signal samples comprises a received calibration signal.

7. The method of claim 1, wherein the series of channel signal samples comprises energy received over the air and a calibration signal from an internal source.

8. The method of claim 1, wherein said determining a next value of said gain imbalance correction parameter comprises using a stochastic gradient equation.

9. The method of claim 1, wherein said down-converting said series of corrected second channel samples produce a quadrature down-converted signal comprises multiplying said series of corrected second channel samples by a sine wave signal.

10. The method of claim 1, further comprising:
down-converting said series of corrected second channel samples to produce a second in-phase down-converted signal;
filtering said second in-phase down-converted signal to determine a phase error measurement; and
determining a next value of said phase correction parameter based upon said gain imbalance corrector parameter and said phase error measurement.

11. The method of claim 1, wherein said phase correction parameter is obtained using an adaptive correction algorithm.

12. The method of claim 1, wherein said gain imbalance correction parameter is obtained using an adaptive correction algorithm.

13. A receiver, comprising:
a first correction module to remove at least a portion of a DC offset from a series of first channel signal samples to produce a series of corrected first channel samples;

a linear combiner to combine said series of corrected first channel samples and a series of corrected second channel signal samples to produce a series of corrected second channel samples, wherein parameters for said linear combiner are computed at least in part from a gain imbalance correction parameter and a phase correction parameter;

a first down-converter to down-convert said series of corrected first channel samples to produce a first in-phase down-converted signal;

a second down-converter to down-convert said series of corrected second channel samples to produce a quadrature down-converted signal; and an adaptive correction module to compute a next value of said gain imbalance correction parameter based upon at least said first in-phase down-converted signal and said quadrature down-converted signal.

14. The receiver of claim 13, wherein said linear combiner is configured to multiply said series of first channel signal samples by said phase correction parameter.

15. The receiver of claim 13, wherein said linear combiner is configured at least in part to add an offset to remove at least a portion of a DC offset of said series of corrected second channel signal samples.

16. The receiver of claim 13, wherein said linear combiner is configured at least in part to add an offset to remove at least a portion of a DC offset of said series of second channel signal samples to produce offset samples, multiply said offset samples by said gain imbalance correction parameter, and multiplying said corrected first channel samples by said phase correction parameter.

17. The receiver of claim 13, wherein said adaptive correction module is configured to compute a ratio corresponding to said first in-phase down-converted signal and said quadrature down-converted signal.

18. The receiver of claim 13, wherein the series of channel signal samples comprises a calibration signal.

19. The receiver of claim 13, wherein the series of channel signal samples comprises a signal from an external source and a calibration signal from an internal source.

20. The receiver of claim 13, wherein said adaptive correction module comprises a stochastic gradient equation.

21. The receiver of claim 13, wherein said adaptive correction module is configured to determine a next value of said phase correction parameter based upon a gain imbalance measurement and a phase error measurement.

22. The receiver of claim 13, wherein said phase correction parameter is obtained using an adaptive correction algorithm.

23. The receiver of claim 13, wherein said adaptive correction module comprises an adaptive phase correction algorithm.

24. The receiver of claim 13, wherein said adaptive correction module comprises an adaptive gain correction algorithm.

25. The receiver of claim 13, wherein said first down-converter is configured to operate on digital data.

26. The receiver of claim 13, wherein said adaptive correction module is configured to operate on digital data.

27. A receiver, comprising:

a first correction module to remove at least a portion of a DC offset from a series of first channel signal samples to produce a series of corrected first channel samples;

a linear combiner to combine said series of corrected first channel samples and a series of corrected second channel signal samples to produce a series of corrected second channel samples, wherein parameters for said linear combiner are computed at least in part from a gain imbalance correction parameter and a phase correction parameter;

a first down-converter to down-convert said series of corrected first channel samples to produce an in-phase down-converted signal;

a second down-converter to down-convert said series of corrected second channel samples to produce a quadrature down-converted signal; and means for computing said gain imbalance correction parameter and said phase correction parameter using at least said in-phase and quadrature down-converted signals.

* * * * *

UNITED STATES PATENT AND TRADEMARK OFFICE
CERTIFICATE OF CORRECTION

PATENT NO. : 6,842,489 B2
DATED : January 11, 2005
INVENTOR(S) : Wesley K. Masenten It is certified that error appears in the above-identified patent and that said Letters Patent is hereby corrected as shown below:

Column 18,
Line 15, delete "an" and insert -- and said --.
Line 29, after "and multiplying said," delete "series of" --.
Line 45, after "second channel samples," insert -- to --.
Line 56, delete "corrector" and insert -- correction --.

Column 19,
Line 2, after "and a series of," delete "corrected".
Line 24, after "said series of," delete "corrected".

Column 20,
Line 24, after "and a series of," delete "corrected".

Signed and Sealed this

Twenty-first Day of March, 2006

JON W. DUDAS
*Director of the United States Patent and Trademark Office*